US012193200B2

(12) United States Patent
Burgermeister et al.

(10) Patent No.: US 12,193,200 B2
(45) Date of Patent: Jan. 7, 2025

(54) POWER CONVERTER

(71) Applicant: Lenze Swiss AG, Romanshorn (CH)

(72) Inventors: Andreas Burgermeister, Mauren (CH); Beat Heim, Wilen (CH); Dieter Tanner, Schocherswil (CH)

(73) Assignee: Lenze Swiss AG, Romanshorn (CH)

( * ) Notice: Subject to any disclaimer, the term of this patent is extended or adjusted under 35 U.S.C. 154(b) by 421 days.

(21) Appl. No.: 17/779,403

(22) PCT Filed: Nov. 24, 2020

(86) PCT No.: PCT/EP2020/083212
§ 371 (c)(1),
(2) Date: Oct. 14, 2022

(87) PCT Pub. No.: WO2021/105124
PCT Pub. Date: Jun. 3, 2021

(65) Prior Publication Data
US 2023/0023737 A1  Jan. 26, 2023

(30) Foreign Application Priority Data
Nov. 25, 2019 (DE) .................. 10 2019 218 207.0

(51) Int. Cl.
H05K 7/20 (2006.01)
H02M 7/00 (2006.01)

(52) U.S. Cl.
CPC ......... *H05K 7/20909* (2013.01); *H02M 7/003* (2013.01)

(58) Field of Classification Search
CPC .............................. H05K 7/2909; H02M 7/003
See application file for complete search history.

(56) References Cited

U.S. PATENT DOCUMENTS

| 8,254,076 B2 * | 8/2012 | Ledezma ................ H02P 27/14 |
| | | 361/118 |
| 10,537,046 B1 * | 1/2020 | Ledezma ........... H05K 7/20936 |
| 2008/0130232 A1 | 6/2008 | Yamamoto et al. |
| 2015/0116937 A1 | 4/2015 | Huesgen et al. |
| 2019/0246527 A1 * | 8/2019 | Ionescu ............. H05K 7/20909 |

FOREIGN PATENT DOCUMENTS

| DE | 10 2007 057 471 A1 | 6/2008 |
| DE | 10 2007 043 536 A1 | 3/2009 |

OTHER PUBLICATIONS

International Search Report (PCT/ISA/210) issued in PCT Application No. PCT/EP2020/083212 dated Feb. 25, 2021 with English translation (four (4) pages).
German-language Written Opinion (PCT/ISA/237) issued in PCT Application No. PCT/EP2020/083212 dated Feb. 25, 2021 (seven (7) pages).

* cited by examiner

*Primary Examiner* — Jue Zhang
(74) *Attorney, Agent, or Firm* — Crowell & Moring LLP

(57) ABSTRACT

A power converter includes: a first circuit board; a cooling body; a housing, wherein the cooling body and the housing surround the first circuit board; a heat-generating component which is arranged on a side of the first circuit board facing the cooling body and which is coupled to the cooling body in a heat-conducting manner; and further components. The cooling body, the housing and the first circuit board border a first volume, in which the heat-generating component is arranged. The cooling body, the housing and the first circuit board border a second volume, in which the further components are arranged.

12 Claims, 3 Drawing Sheets

POWER CONVERTER

BACKGROUND AND SUMMARY

The invention relates to a power converter.

The object of the invention is the provision of a power converter which can be produced in a simple and cost-effective manner, and which permits the effective cooling of all power converter components.

The power converter comprises a first circuit board.

The power converter further comprises a cooling body.

The power converter further comprises a housing, wherein the cooling body and the housing surround the first circuit board.

The power converter further comprises a heat-generating component, which is arranged on a side of the first circuit board facing the cooling body, and which is coupled to the cooling body in a heat-conducting manner. The heat-generating component can be, for example, a power semiconductor module having a plurality of IGBTs which, for example, constitute a three-phase bridge inverter. The heat-generating component can also be, for example, a DC/DC converter with power semiconductors, etc.

The power converter comprises further conventional components, for example capacitors, resistors, reactance coils, ICs, microcontrollers, etc. In service, these further components preferably generate less heat than the heat-generating component.

The cooling body, the housing and the first circuit board constitute or delimit a first volume or a first space, in which the heat-generating component is arranged.

Additionally, the cooling body, the housing and the first circuit board simultaneously constitute or delimit a second volume or a second space, in which the further components are arranged in a thermally separate manner from the first volume.

According to one embodiment, the power converter comprises a conventional ventilator, which is arranged in the second volume and which, in an essentially exclusive manner, generates a circulation of air in the second volume.

According to one embodiment, the cooling body, the housing and the first circuit board are geometrically configured such that the circulation of air in the second volume is greater, and particularly is more than 10 times greater than a circulation of air in the first volume. As a result, it is particularly prevented that a rapid exchange of air occurs between the two volumes, such that waste heat from the heat-generating component, insofar as possible, does not penetrate the second volume as a result of the circulation of air.

According to one embodiment, the housing is configured such that the ventilator executes the circulation of air exclusively within the housing. In particular, the housing is configured such that any exchange of air between the interior of the housing and the surrounding environment of the housing is essentially prevented.

According to one embodiment, the ventilator is an axial ventilator having an axial impeller, the axis of rotation of which is oriented in parallel with the first circuit board.

According to one embodiment, the power converter comprises a second circuit board, which is oriented in a plane-parallel arrangement to the first circuit board. The ventilator can be arranged between the first and the second circuit board. The ventilator can be configured such that it essentially generates an airflow around the second circuit board. The second circuit board can be arranged (exclusively) in the second volume. The first or second circuit board can comprise a circuit board plug-in connector, which is employed for the connection of the ventilator. The second circuit board can comprise a further circuit board plug-in connector, which is employed for the connection of a control unit which is arranged outside the housing.

According to one embodiment, the power converter comprises a retaining element, particularly a plastic molding, wherein the retaining element holds, or mechanically secures, or carries the ventilator and the second circuit board, wherein the retaining element, for example, is braced on the first circuit board.

According to one embodiment, the retaining element is geometrically configured such that an airflow which is generated by means of the ventilator is directed, particularly exclusively, into the second volume.

According to one embodiment, the cooling body comprises cooling ribs on one side only, which is averted from the heat-generating component, i.e. an outer side of the housing.

According to one embodiment, the power converter features a protection rating of IP 66 or higher, according to IEC 60 529 (EN 60 529).

According to one embodiment, the power converter is a regenerative power supply unit or a frequency converter. A regenerative power supply unit injects electrical energy/power which is present, for example, in an intermediate circuit, back into a power supply grid. For further information, reference should be made to the relevant specialized literature.

The invention is described in detail hereinafter, with reference to the drawings.

DETAILED DESCRIPTION OF THE DRAWINGS

Figure 1:
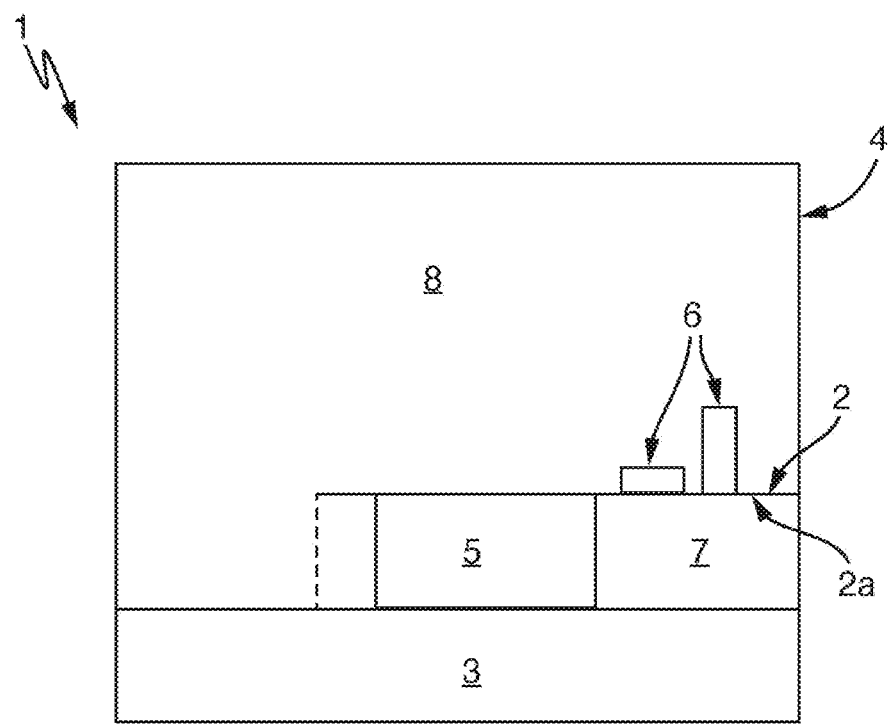
FIG. 1 is a highly schematic cross-sectional representation of a power converter according to an embodiment of the invention.

FIG. 1 shows a highly schematic cross-sectional representation of a power converter 1, for example in the form of a frequency converter or a regenerative power supply unit.

The power converter 1 comprises a first circuit board 2.

The power converter 1 further comprises a cooling body 3, which is configured in the form of a casting. The cooling body 3 comprises fastening elements for the fastening thereof to its intended location, for example a wall.

The power converter 1 further comprises a housing 4, wherein the cooling body 3 and the housing 4 surround the first circuit board 2.

The power converter 1 further comprises a heat-generating component 5, which is arranged on a side 2a of the first circuit board 2 facing the cooling body 3, and which is coupled in a thermally conductive manner to the cooling body 3, for the evacuation of heat to a surrounding environment of the housing 4.

The heat-generating component 5 is electrically contact-connected on the first circuit board 2. On the first circuit board 2, further unrepresented components can be arranged or electrically contact-connected, for example capacitors, particularly intermediate circuit capacitors, and further constituent components of an intermediate circuit.

The power converter 1 comprises a multiplicity of conventional further components 6.

The cooling body 3, the housing 4 and the first circuit board 2 delimit a first volume 7, in which the heat-generating component 5 is arranged.

The cooling body 3, the housing 4 and the first circuit board 2 also delimit a second volume 8, in which the further components 6 are arranged.

Figure 2:
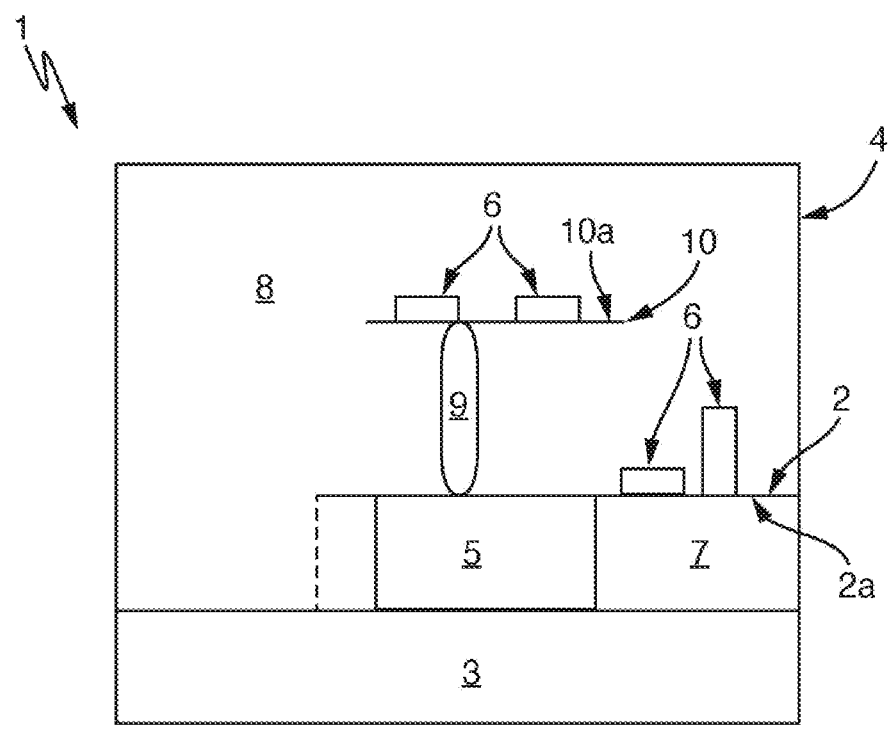
FIG. 2 is a highly schematic cross-sectional representation of a power converter according to the embodiment of the invention, with further components.
Figure 3:
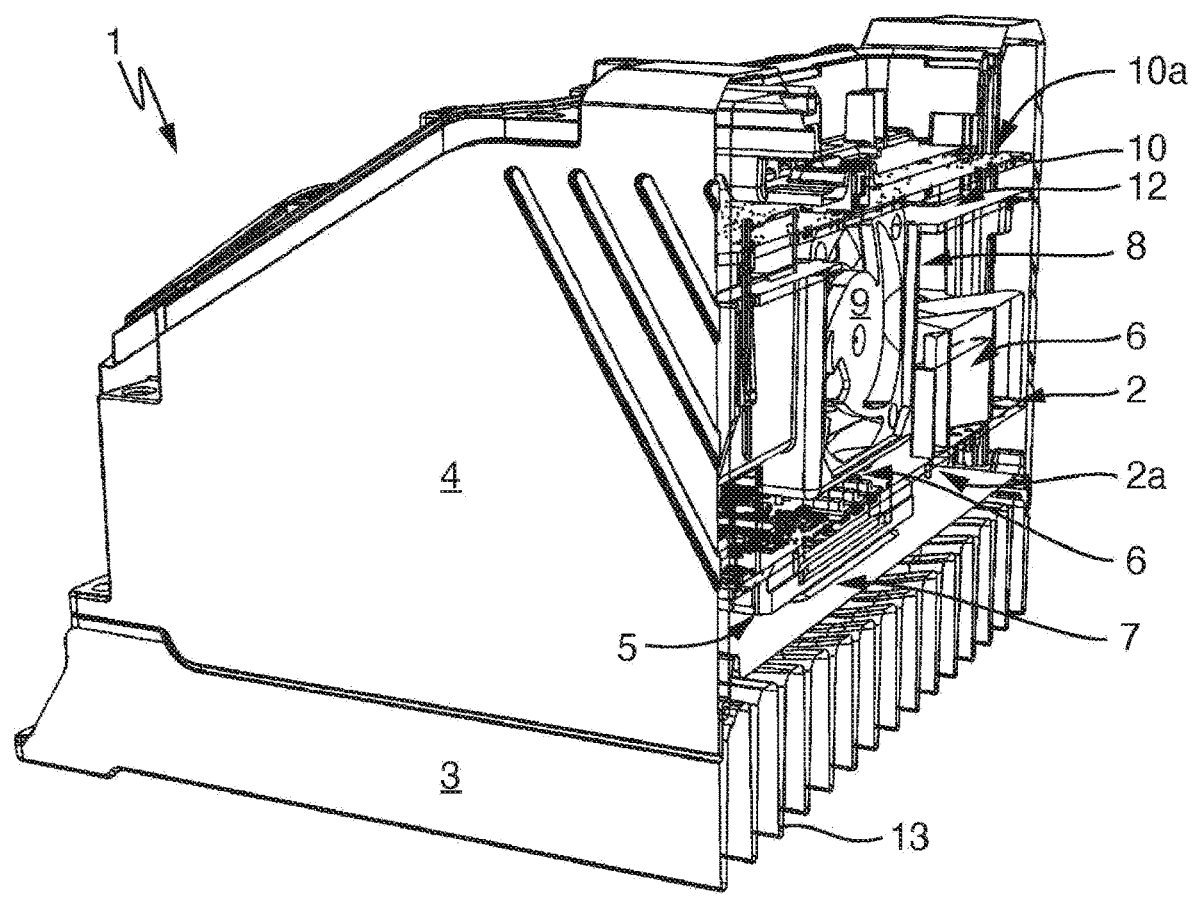
FIG. 3 is a detailed perspective view of a partially opened power converter according to an embodiment of the invention.
Figure 4:
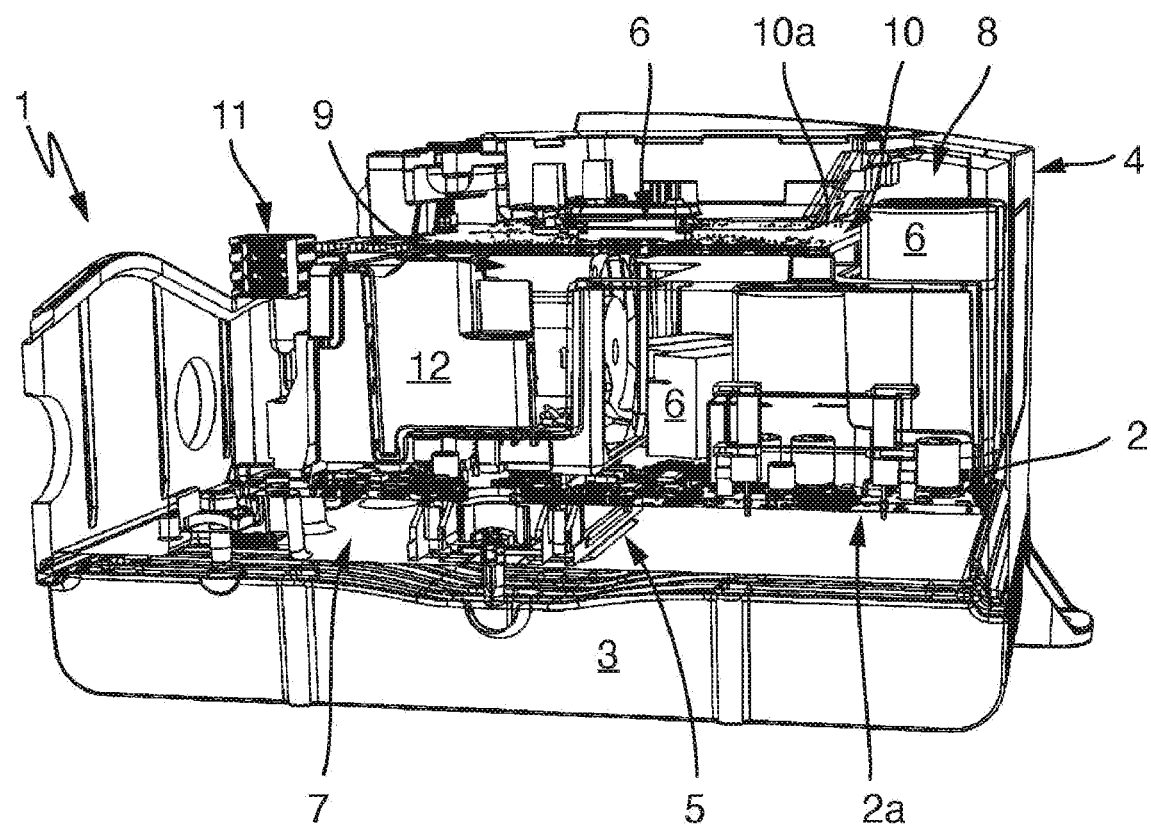
FIG. 4 is a further perspective view of the housing of a power converter according to an embodiment of the invention.

With reference to FIGS. 2 to 4, the power converter 1 further comprises an axial ventilator 9, which is arranged in the second volume 8. An axis of rotation of the axial ventilator 9 is oriented in parallel with the first circuit board 2.

The power converter 1 further comprises a second circuit board 10 having a component mounting side 10a, wherein further components 6 are arranged on the component mounting side 10a. The second circuit board 10 is oriented in a plane-parallel arrangement to the first circuit board 2. The component mounting side 10a is that side of the circuit board which is furthest removed from the heat-generating component 5. In consequence, particularly heat-sensitive components such as, for example, heat-sensitive control electronics, are arranged on the component mounting side 10a.

On the second circuit board 10, an unrepresented control unit can be arranged, for example in the form of a microprocessor, which generates control signals for the component 5.

The power converter 1 further comprises a retaining element 12 in the form of a plastic molding, wherein the retaining element 12 holds the ventilator 9 and the second circuit board 10.

The retaining element 12, the cooling body 3, the housing 4, the first circuit board 2 and the second circuit board 10 are geometrically configured and arranged relative to one another such that an airflow generated by means of the ventilator 9 is essentially directed exclusively into the second volume 8, as a result of which the circulation of air in the second volume 8 is substantially greater than the circulation of air in the first volume 7.

The cooling body 3 comprises cooling ribs 13 on one side only, which is averted from the heat-generating component 5.

The power converter 1 assumes a protection rating in accordance with IP 66.

As a result of the separation of the first volume 7 from the second volume 8, any input of heat from the first heat-generating component 5, which is arranged in the first volume 7, in the direction of the further components 6, which are arranged in a thermally separate manner from the heat-generating component 5 in the second volume 8, is reduced.

Evacuation of heat from the heat-generating component 5 is essentially executed towards the exterior, and not to the interior of the housing. Cooling of the further components 6 is essentially executed by the circulation of air in the second volume 8 and the evacuation of heat via the region of the cooling body 3 which adjoins the second volume 8.

The invention claimed is:

1. A power converter, comprising:
   a first circuit board;
   a cooling body;
   a housing, wherein the cooling body and the housing surround the first circuit board;
   a heat-generating component, which is arranged on a side of the first circuit board facing the cooling body, and which is coupled to the cooling body in a heat-conducting manner; and
   further components,
   wherein the cooling body, the housing and the first circuit board delimit a first volume, in which the heat-generating component is arranged,
   and
   wherein the cooling body, the housing and the first circuit board delimit a second volume, in which the further components are arranged.

2. The power converter according to claim 1, further comprising:
   a ventilator, which is arranged in the second volume and which generates a circulation of air in the second volume.

3. The power converter according to claim 2, wherein the cooling body, the housing and the first circuit board are geometrically configured such that the circulation of air in the second volume is greater than a circulation of air in the first volume.

4. The power converter according to claim 3, wherein the circulation of air is more than 10 times greater than the circulation of air in the first volume.

5. The power converter according to claim 3, wherein the housing is configured such that the ventilator executes the circulation of air exclusively within the housing.

6. The power converter according to claim 2, wherein vthe ventilator is an axial ventilator having an axis of rotation oriented in parallel with the first circuit board.

7. The power converter according to claim 2, further comprising:
   a second circuit board, which is oriented in a plane-parallel arrangement to the first circuit board.

8. The power converter according to claim 7, further comprising:
   a retaining element, wherein the retaining element holds the ventilator and the second circuit board.

9. The power converter according to claim 8, wherein the retaining element is geometrically configured such that an airflow, which is generated via the ventilator, is directed into the second volume.

10. The power converter according to claim 1, wherein the cooling body comprises cooling ribs on one side only, which side is averted from the heat-generating component.

11. The power converter according to claim 1, wherein the power converter has a protection rating of IP 66 or higher.

12. The power converter according to claim 1, wherein the power converter is a regenerative power supply unit or a frequency converter.

* * * * *